(12) United States Patent
Nishimura et al.

(10) Patent No.: US 9,269,644 B2
(45) Date of Patent: Feb. 23, 2016

(54) METHOD FOR PRODUCING SEMICONDUCTOR DEVICE

(71) Applicants: Yoshitaka Nishimura, Nagano (JP); Akira Morozumi, Nagano (JP); Kazunaga Ohnishi, Nagano (JP); Eiji Mochizuki, Nagano (JP); Yoshikazu Takahashi, Nagano (JP)

(72) Inventors: Yoshitaka Nishimura, Nagano (JP); Akira Morozumi, Nagano (JP); Kazunaga Ohnishi, Nagano (JP); Eiji Mochizuki, Nagano (JP); Yoshikazu Takahashi, Nagano (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/016,754

(22) Filed: Sep. 3, 2013

(65) Prior Publication Data

US 2014/0080262 A1 Mar. 20, 2014

Related U.S. Application Data

(62) Division of application No. 11/327,482, filed on Jan. 9, 2006, now abandoned.

(30) Foreign Application Priority Data

Jan. 19, 2005 (JP) .................. 2005-011369

(51) Int. Cl.
*H01L 23/00* (2006.01)
*H01L 23/34* (2006.01)
(Continued)

(52) U.S. Cl.
CPC ............ *H01L 23/34* (2013.01); *H01L 23/3735* (2013.01); *H01L 24/32* (2013.01); *H01L 24/83* (2013.01); *H05K 3/0061* (2013.01); *H05K 3/3463* (2013.01); *H01L 2224/291* (2013.01); *H01L 2224/29109* (2013.01); *H01L 2224/29111* (2013.01); *H01L 2224/32225* (2013.01); *H01L 2224/83801* (2013.01); *H01L 2924/0103* (2013.01); *H01L 2924/014* (2013.01); *H01L 2924/0105* (2013.01); *H01L 2924/01005* (2013.01); *H01L 2924/01006* (2013.01); *H01L 2924/01013* (2013.01); *H01L 2924/01019* (2013.01); *H01L 2924/01029* (2013.01); *H01L 2924/0132* (2013.01); *H01L 2924/01033* (2013.01); *H01L 2924/0134* (2013.01); *H01L 2924/01042* (2013.01); *H01L 2924/01047* (2013.01); *H01L 2924/01049* (2013.01);
(Continued)

(58) Field of Classification Search
USPC .................................... 438/122, 125
IPC .................................... H01L 23/49568
See application file for complete search history.

(56) References Cited

U.S. PATENT DOCUMENTS

| 4,806,309 A | 2/1989 | Tulman |
| 5,328,751 A * | 7/1994 | Komorita et al. ............. 428/209 |

(Continued)

FOREIGN PATENT DOCUMENTS

| JP | H02-077143 A | 3/1990 |
| JP | 2003046032 A * | 2/2003 |

*Primary Examiner* — Eugene Lee
(74) *Attorney, Agent, or Firm* — Manabu Kanesaka

(57) ABSTRACT

A method for producing a semiconductor device includes solder-connecting a semiconductor chip, onto an insulating substrate including a ceramic board and having conductor layers on two surfaces thereof, with a lead-free solder; warping a radiating base such that a surface of the radiating base on a side opposite to the insulating substrate is convex; and solder-connecting the insulating substrate onto the warped radiating base with the lead-free solder so as to provide a substantially flat solder-connected radiating base.

16 Claims, 15 Drawing Sheets

(51) Int. Cl.
*H01L 23/373* (2006.01)
*H05K 3/00* (2006.01)
*H05K 1/03* (2006.01)
*H05K 3/34* (2006.01)

(52) U.S. Cl.
CPC ............... *H01L2924/01051* (2013.01); *H01L 2924/01068* (2013.01); *H01L 2924/01082* (2013.01); *H01L 2924/10253* (2013.01); *H01L 2924/1305* (2013.01); *H01L 2924/13055* (2013.01); *H01L 2924/15787* (2013.01); *H01L 2924/3511* (2013.01); *H05K 1/0306* (2013.01); *H05K 3/341* (2013.01)

(56) References Cited

U.S. PATENT DOCUMENTS

| | | | |
|---|---|---|---|
| 5,414,303 A * | 5/1995 | Gonya et al. | 257/772 |
| 7,019,975 B2 * | 3/2006 | Nagatomo et al. | 361/704 |
| 7,038,313 B2 * | 5/2006 | Mochizuki et al. | 257/713 |
| 7,348,493 B2 * | 3/2008 | Osanai et al. | 174/256 |
| 7,355,853 B2 * | 4/2008 | Emoto et al. | 361/704 |
| 7,532,481 B2 * | 5/2009 | Nagase et al. | 361/739 |
| 2002/0149113 A1 * | 10/2002 | Ray et al. | 257/772 |
| 2003/0173660 A1 | 9/2003 | Kitamura et al. | |
| 2004/0194861 A1 | 10/2004 | Endou et al. | |
| 2004/0232544 A1 | 11/2004 | Mochizuki et al. | |

\* cited by examiner

METHOD FOR PRODUCING SEMICONDUCTOR DEVICE

CROSS-REFERENCE TO RELATED APPLICATION

This is a divisional application of Ser. No. 11/327,482 filed on Jan. 9, 2006.

BACKGROUND OF THE INVENTION AND RELATED ART STATEMENT

The present invention relates to a method of producing a semiconductor device such as a power semiconductor module comprising a power semiconductor.

Power semiconductor modules capable of working even under large current and high voltage have recently been used in various fields. Such power modules comprise a power semiconductor such as an Insulated Gate Bipolar Transistor (IGBT) and a Free Wheeling Diode (FWD) as a main component.

FIG. 11 is a schematic cross-sectional view showing a principal part of a conventional power semiconductor module.

In a power semiconductor module 100 shown in FIG. 11, a semiconductor chip 103 of a power semiconductor, etc. is connected by a solder layer 102 onto an insulating substrate 101, which comprises a ceramic board 101a of aluminum nitride (AlN), etc. and conductor layers 101b and 101c of copper (Cu), aluminum (Al), etc. formed on the both surface thereof. One surface of the insulating substrate 101 is connected to the semiconductor chip 103 in this manner, and the opposite surface is connected by a solder layer 104 to a radiating base 105 composed of a metal such as copper to dissipate heat generated in the semiconductor chip 103.

However, in the production of the power semiconductor module 100 having such a structure, two members with different heat expansion coefficients, the insulating substrate 101 having the ceramic board 101a and the metal radiating base 105, are connected by the solder layer 104, whereby the originally flat radiating base 105 is warped after the soldering occasionally.

FIG. 12 is a schematic cross-sectional view showing a principal part of the warped radiating base. It should be noted that the same reference signs are used in FIGS. 11 and 12 for representing common components.

For example, in the case of using aluminum nitride for the ceramic board 101a of the insulating substrate 101 and using copper for the radiating base 105, aluminum nitride has a heat expansion coefficient of about 4.5 ppm/K and copper has a heat expansion coefficient of about 16.5 ppm/K, resulting in a relatively large difference in the coefficients. Thus, copper is shrunk more than aluminum nitride in a cooling step after the soldering, whereby the radiating base 105 is often convexly warped in the direction of the insulating substrate 101. When the radiating base 105 is warped in this manner, an assembling step after the soldering, etc. is adversely affected or the performance of the power semiconductor module 100 is occasionally deteriorated depending on the warpage.

Some proposals have been made to prevent convex warpage of radiating members such as the radiating base 105, formed in a connecting process of soldering, etc. The proposals include a module obtained by connecting a radiating metal layer to a ceramic board and by connecting the radiating metal layer to a radiating member via a brazing material layer with a connection area of 300 mm$^2$ or less (JP-A-2004-140199). The proposals further include a method of connecting a ceramic board to a radiating member after convexly warping the radiating member to the side opposite to the ceramic board, thereby compensating for warpage formed in the connecting process (JP-A-2003-46032 and JP-A-4-96355).

Additionally, in order to decrease air bubbles in the soldering layer, the proposals further include a method of connecting a ceramic board to a radiating member after attaching copper plates having different thicknesses to both surfaces of the ceramic board, the copper plate on the side of the radiating member having a larger thickness, thereby convexly warping the ceramic board to the radiating member in the connecting process by utilizing the thickness difference, to remove air bubbles in the soldering layer (JP-A-10-270612).

However, in production of the above power semiconductor modules, in the case of using a solder for connecting members, particularly members with different heat expansion coefficients, the following problems can result.

Currently many solders for connecting members of electronic devices and parts including the power semiconductor modules contain lead (Pb). When electronic devices and parts using lead-containing solders are discarded, left in an outdoor location, and exposed to acid rain, etc., lead in the solders may be eluted off to cause environment contamination. Therefore, it is preferred that so-called lead-free solders, which are mainly composed of tin (Sn) etc. without lead, are used in various electronic devices and parts.

The lead-free solders have higher hardness as compared with the lead-containing solders. In the case of using a lead-containing solder for connecting the insulating substrate 101 and the flat radiating base 105 of the power semiconductor module 100 shown in FIGS. 11 and 12, though the radiating base 105 may be convexly warped by sintering in the direction of the insulating substrate 101, the solder layer 104 can be creep-deformed immediately after the soldering because of the softness of the solder, to relax the stress between them. As a result, the warpage of the radiating base 105 is removed, and the radiating base 105 is returned to the original flat or approximately flat state.

In contrast, in the case of using a lead-free solder for the connection, the solder is hard and thus the solder layer 104 is not creep-deformed, so that the radiating base 105 is not returned to the original flat state with the convex warpage remaining. The amount of the warpage is large, approximately 200 to 500 μm, and as a result an assembling step after the soldering is adversely affected or the performance of the power semiconductor module 100 is deteriorated occasionally as described above.

FIG. 13 is a schematic cross-sectional view showing a principal part of the step of assembling the power semiconductor module. It should be noted that the same reference signs are used in FIGS. 11, 12, and 13 for representing common components.

As shown in FIG. 13, in the power semiconductor module 100, generally, the insulating substrate 101 and the radiating base 105 are solder-connected, and then the radiating base 105 is fixed to a cooling fin 200 by a screw, etc.

In the case of using a lead-containing solder for connecting the insulating substrate 101 and the radiating base 105, the convex warpage of the radiating base 105, formed in the soldering step, is removed thereafter. Therefore, the contact thermal resistance between the radiating base 105 and the cooling fin 200 is relatively small, and heat generated in the semiconductor chip 103 is efficiently dissipated from the radiating base 105.

In contrast, in a case where a lead-free solder is used for connecting to the insulating substrate 101 and thus the radiating base 105 is largely convex-warped in the direction of the insulating substrate 101, a large gap 201 is formed between the radiating base 105 and the flat surface of the cooling fin 200 as shown in FIG. 13. When such a gap 201 is formed, the contact thermal resistance is increased, and the efficiency of dissipating heat generated in the semiconductor chip 103 is lowered, so that the temperature of the connection part of the semiconductor chip 103 may be abnormally increased to cause thermal destruction. Further, in a case where the radiating base 105 is largely convex-warped toward the insulating substrate 101, occasionally a problem occurs, for example, the ceramic board 101a is cracked in the step of screwing the radiating base 105 to the cooling fin 200.

The warpage can be reduced by using materials having low heat expansion coefficients such as copper molybdenum (CuMo) composite materials and aluminum silicon carbides (AlSiC) for the radiating base 105 instead of copper to reduce the heat expansion coefficient difference between the radiating base 105 and the insulating substrate 101. However, as compared with copper, these materials are poorer in thermal conductivity and disadvantageous in heat dissipation though they have low heat expansion coefficients. Further, these materials are more costly than copper.

SUMMARY OF THE INVENTION

In view of the above problems, an object of the present invention is to provide a low-cost, high-reliability, semiconductor device designed with environmental impact, and a method for producing the same.

To solve the above problems, according to the invention, there is provided a semiconductor device comprising a radiating base, an insulating substrate solder-connected to the radiating base, and a semiconductor chip solder-connected to the insulating substrate, the insulating substrate comprising a ceramic board and conductor layers disposed on the both surfaces of the ceramic board, wherein the insulating substrate is connected to each of the semiconductor chip and the radiating base with a solder free of lead, and the radiating base is lead-free solder-connected in an approximately flat state.

In the semiconductor device, the lead-free solder is used for connecting the insulating substrate and the radiating base and for connecting the insulating substrate and the semiconductor chip, whereby elution of lead from the soldering portions is not caused even when the device is placed in an outdoor location. Further, in the semiconductor device, the radiating base is solder-connected in the approximately (i.e., substantially) flat state to the insulating substrate, whereby the radiating base can be attached to a flat surface of another member such as a cooling fin without a large gap with a preferred contact area. In addition, deterioration of the ceramic board can be prevented in the attaching step.

Further, according to the invention, there is provided a method for producing a semiconductor device comprising a radiating base, an insulating substrate solder-connected to the radiating base, and a semiconductor chip solder-connected to the insulating substrate, the insulating substrate comprising a ceramic board and conductor layers disposed on the both surfaces of the ceramic board, wherein the semiconductor chip is solder-connected onto the insulating substrate with a solder free of lead, and the insulating substrate is solder-connected onto the radiating base with the solder free of lead after the radiating base is warped such that the surface on the side opposite to the insulating substrate is convex and is made approximately flat by the solder connecting.

In the method for producing the semiconductor device, the lead-free solder is used for connecting the insulating substrate and the radiating base and for connecting the insulating substrate and the semiconductor chip, so that elution of lead is not caused. Further, in the step of solder-connecting the radiating base and the insulating substrate, the insulating substrate is connected with the lead-free solder after warping the radiating base, so that the radiating base is connected to the insulating substrate in the approximately flat state after the soldering.

In the semiconductor device of the invention, the lead-free solder is used for connecting the insulating substrate and the radiating base and for connecting the insulating substrate and the semiconductor chip, lead is not eluted so as to prevent environmental contamination. Further, in the semiconductor device of the invention, the radiating base is in the approximately flat state after the connecting step using the lead-free solder, so that a large gap is not formed between the radiating base and a cooling fin, etc. and the contact thermal resistance is lowered, whereby heat generated in the semiconductor chip can be dissipated efficiently.

Thus, there is provided a high-reliability semiconductor device that can stably work without abnormal temperature rise in the semiconductor chip. Further, components of the semiconductor device may be the same as conventional ones except for using the lead-free solder, whereby a low-cost, high-reliability, semiconductor device can be realized.

DETAILED DESCRIPTION OF THE PREFERRED EMBODIMENTS

An embodiment of a power semiconductor module according to the present invention is described in detail below with reference to the drawings.

Figure 1:
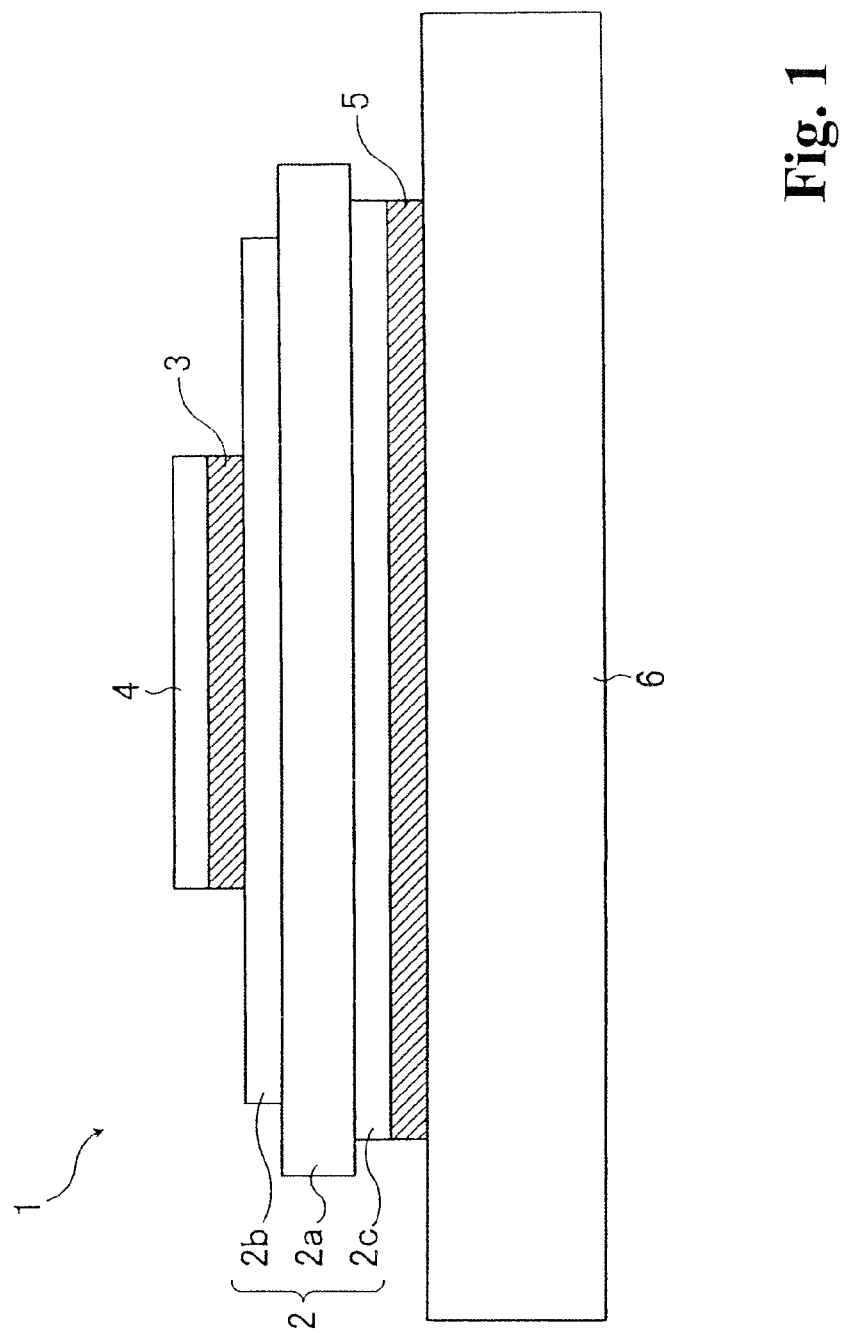
FIG. 1 is a schematic cross-sectional view showing a principal part of a power semiconductor module.

FIG. 1 is a schematic cross-sectional view showing a principal part of a power semiconductor module.

In the power semiconductor module 1 shown in FIG. 1, a semiconductor chip 4 is connected by a solder layer 3 onto an insulating substrate 2, which has conductor layers 2b and 2c on the both surfaces of a ceramic board 2a. One surface of the insulating substrate 2 is connected with the semiconductor chip 4 in this manner, and the opposite surface is connected by a solder layer 5 to a radiating base 6.

For example, the ceramic board 2a for the insulating substrate 2 may be a board mainly composed of alumina ($Al_2O_3$) having an appropriate thickness. Further, the conductor layers 2b and 2c may comprise copper foils with appropriate thicknesses.

For example, the solder layer 3 for connecting the insulating substrate 2 and the semiconductor chip 4 and the solder layer 5 for connecting the insulating substrate 2 and the radiating base 6 may be a tin-based solder containing a tin component. It should be noted that a lead-free solder containing no lead is used in both of the solder layers 3 and 5. The lead-free solder is hereinafter described in detail.

For example, the semiconductor chip 4 is a power semiconductor such as IGBT and FWD, which comprises silicon (Si) as a main component, and may generate heat with relatively high temperature while working.

For example, the radiating base 6 may be composed of copper mainly from the viewpoints of the thermal conductivity and costs. Further, a cooling fin may be attached to the lower surface of the radiating base 6 (the surface on the side opposite to the insulating substrate 2) though it is not shown there.

When the power semiconductor module 1 is driven, the semiconductor chip 4 generates heat, and the heat is transferred to the solder layer 3, the insulating substrate 2, the solder layer 5, and the radiating base 6 in this order, and dissipated. Thus, temperature rise in the semiconductor chip 4 is prevented, whereby the normal operation and the connection to the conductor layer 2b, etc. are maintained.

In formation of the power semiconductor module 1 having the above structure, before the solder-connecting step using the lead-free solder, the radiating base 6 is warped such that the surface on the side opposite to the solder layer 5 is convex. Thus, the radiating base 6 is made concave beforehand. For example, in a case where the radiating base 6 is flat and is convexly warped by soldering toward the insulating substrate 2 within the range of about 200 to 500 μm, the amount of the warpage formed beforehand is about 100 to 600 μm. This range of the amount of the warpage formed beforehand is only exemplary, and the amount is appropriately selected depending on the thicknesses and areas of the radiating base, the insulating substrate, and the conductor layers in the insulating substrate. Further, the amount of the warpage can be reduced by combining the following embodiments, and can be 100 μm or less.

The radiating base 6 is warped in an appropriate amount in this manner, and after the insulating substrate 2 is attached thereto with the lead-free solder layer 5, the radiating base 6 is curved toward the insulating substrate 2 in a cooling process due to the difference of the heat expansion coefficients. As a result, the curve compensates the warpage formed in the radiating base 6 beforehand, and finally the radiating base 6 is in the flat state or the approximately (i.e., substantially) flat, concave or convex state. Although it is ideal that the radiating base 6 is finally made flat, the radiating base 6 may be not completely flat and may be approximately flat concave or beyond flat to convex. As long as the resultant warpage amount of the radiating base 6 is within a predetermined range, the product can be attached to a cooling fin without problems and the performance is not deteriorated.

For example, when the radiating base 6 is connected with the lead-free solder without warping the radiating base 6 beforehand, there is a case where a convex warpage of about 200 to 500 μm toward the insulating substrate 2 is formed in the radiating base 6 to generate a large gap between the radiating base 6 and a cooling fin as described above. In contrast, by concavely warping the radiating base 6 before soldering, the radiating base 6 is in the flat or approximately flat state after the connecting step using the lead-free solder, and generation of a large gap can be prevented between the radiating base 6 and a cooling fin. As a result, the contact thermal resistance between the radiating base 6 and the cooling fin can be lowered, the abnormal temperature rise in the semiconductor chip 4 can be prevented, and the thermal destruction can be prevented, to obtain the high-reliability power semiconductor module 1.

Next, the lead-free solder used for the power semiconductor module 1 is described.

The lead-free solder used for the power semiconductor module 1 may be a tin-based solder containing silver (Ag), bismuth (Bi), copper (Cu), indium (In), antimony (Sb), zinc (Zn), aluminum (Al), etc. When the lead-free solder has a low melting point, heat applied to the radiating base 6 in the soldering step is reduced, and expansion and shrinkage of copper is reduced, whereby warpage of the radiating base 6 can be reduced.

Figure 2:
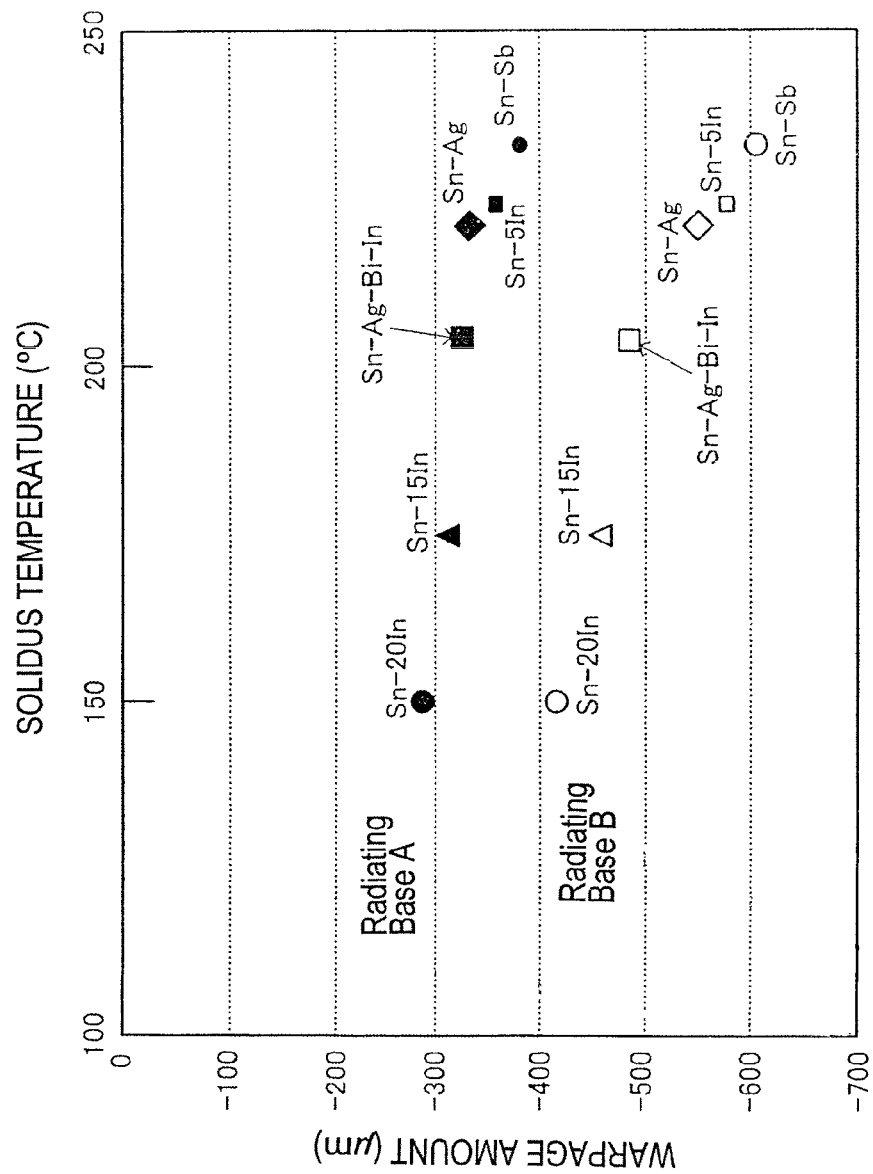
FIG. 2 is a diagram showing a relation between solidus temperature of solders and warpage amount of radiating bases.

FIG. 2 is a diagram showing a relation between solidus temperature of solders and warpage amount of radiating bases. In FIG. 2, the abscissa axis represents the solidus temperature (° C.) and the ordinate axis represents the warpage amount (μm) of the radiating bases.

Here two samples of a radiating base A having a length of 43 mm, a width of 90 mm, and a thickness of 3 mm, and a radiating base B having a length of 59.6 mm, a width of 119.6 mm, and a thickness of 3 mm, which were composed of copper and were flat without warpage, were used as the radiating bases. An insulating substrate, which comprised a board mainly composed of alumina and copper foils formed on the both surface thereof, was solder-connected to each of the samples by using lead-free solders having various compositions, and the resultant warpage amount was measured. In FIG. 2, black signs represent the cases of using the radiating base A, and outline signs represent the cases of using the radiating base B.

The warpage amount was a distance of an end of each radiating base A, B, moved in the soldering, from the flat state with distance of 0 μm. Here the uppermost portion of each radiating base A, B is used as standard, and the moving direction of the end is the minus direction. Further, in the tin-indium-based solders, the compositions were controlled to change the solidus temperatures. In FIG. 2, the values adjacent to the element symbols of the solder composition represent the contents (%) of the elements, and for example, the solder represented by Sn-20In has a composition containing 20% of indium.

In FIG. 2, a warpage amount of each radiating base A, B is plotted against the solidus temperature of each lead-free solder used in the connecting step. It is clear from FIG. 2 that, in both cases of the radiating bases A and B, the warpage amount is reduced as the solidus temperature is lowered. Particularly in the case of tin-indium-based solders, as the indium content is increased to 5%, 15%, and 20%, the solidus temperature is lowered and the warpage amount of the radiating base A, B becomes smaller. The warpage amount of the radiating base A is less than that of the radiating base B, and the warpage can be reduced by using the radiating base A even in the case of using a lead-free solder having a composition of Sn—Sb or Sn—Ag. Thus, in the case of using the lead-free solder having a melting point of less than 250° C., as the melting point of the lead-free solder is lower, the amount of the warpage formed in the radiating base A, B after the soldering is smaller.

In other words, in production of the power semiconductor module 1, as the melting point of the lead-free solder is lowered, heat applied in the soldering can be reduced, whereby the amount of the warpage formed in the radiating base 6 beforehand can be reduced. Thus, it is easier to convert the radiating base 6 to the flat or approximately flat state as compared with a case where a largely warped radiating base 6 is treated with a high temperature to be deformed into flat. Therefore, the radiating base 6 can be prevented from convexly warping toward the insulating substrate 2.

Figure 3:
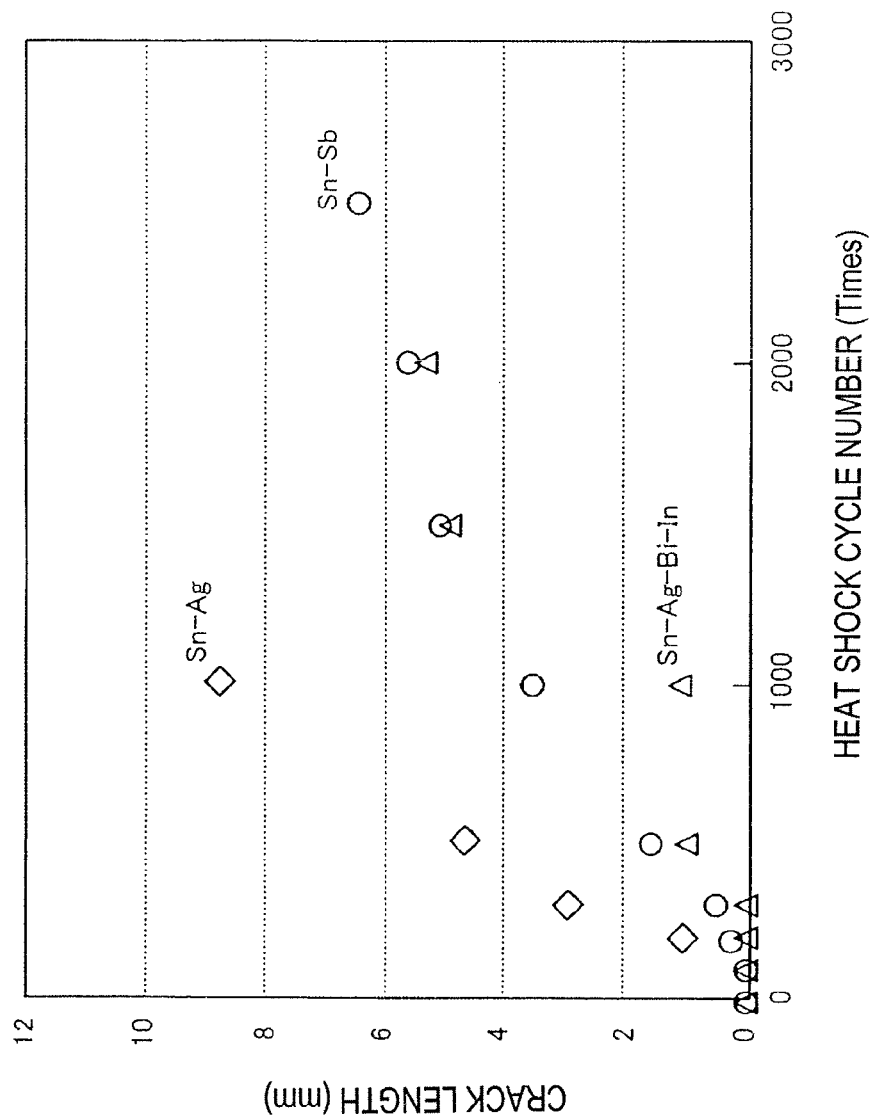
FIG. 3 is a diagram showing results of a heat shock test using lead-free solders.

FIG. 3 is a diagram showing results of a heat shock test using lead-free solders. In FIG. 3, the abscissa axis represents heat shock cycle number (times), and the ordinate axis represents crack length (mm) from a corner of solder connection portion of a radiating base and an insulating substrate.

Herein samples obtained by connecting the radiating base A and the insulating substrate of FIG. 2 with each of the lead-free solders of Sn—Ag, Sn—Sb, and Sn—Ag—Bi—In shown in FIG. 2 were subjected to the heat shock test. The heat shock test was carried out by a method comprising repeating the steps of maintaining the sample at minus 40° C. for 5 minutes and maintaining the sample at 125° C. for 5 minutes, with intervals of maintaining the sample at ordinary temperature for 1 minute. The heat shock test was carried out by using a liquid bath type heat shock test apparatus at a heating and cooling rate of 50° C./min.

It was found from FIG. 3 that the length of the crack formed in the solder connection portion of the radiating base A and the insulating substrate was smaller in the case of using the lead-free solders having a composition of Sn—Sb or Sn—Ag—Bi—In as compared with the case of using the lead-free solder having a composition of Sn—Ag. Particularly in the case of using the lead-free solder having the composition of Sn—Ag—Bi—In, crack was not formed even after 300-times heat shock cycle. Thus, by using the tin-based, lead-free solder containing indium or antimony, the crack resistance of the solder connection can be improved.

For example, in the power semiconductor module 1, when a crack is formed in the solder layer 5 and reaches just below the semiconductor chip 4 connected on the insulating substrate 2, there is a case where the efficiently of heat transfer from the semiconductor chip 4 to the radiating base 6 is reduced, thereby causing temperature rise in the semiconductor chip 4 to shorten the life of the product. By improving the crack resistance, the product can have a longer service life. The improvement of the crack resistance by using the lead-free solder with a certain composition can be observed also in the solder layer 3 between the insulating substrate 2 and the semiconductor chip 4 naturally.

As described above, in the case of using the lead-free solder for connecting the insulating substrate 2 and the radiating base 6 of the power semiconductor module 1, the radiating base 6 is concavely warped beforehand. Further, in addition the composition of the lead-free solder is appropriately selected depending on the desired properties of the power semiconductor module 1. Thus, the convex warpage of the radiating base 6 toward the insulating substrate 2 can be reduced to prevent formation of a large gap between the radiating base 6 and a cooling fin, and generation of a crack in the solder layer 5 can be prevented to maintain the thermal and electrical connection therebetween. Further, by using the lead-free solder also for connecting the semiconductor chip 4 and the insulating substrate 2 of the power semiconductor module 1, generation of a crack in the solder layer 3 can be prevented to maintain the thermal and electrical connection therebetween. Thus, the power semiconductor module 1 can be obtained with a high performance, a high reliability, and a long life.

Furthermore, when the lead-free solder is used for connecting the insulating substrate 2 and the radiating base 6 and for connecting the semiconductor chip 4 and the insulating substrate 2, elution of lead is not caused even in the case of leaving the power semiconductor module 1 in an outdoor location.

Various factors having an impact on the warpage of the radiating base 6 in production of the power semiconductor module 1 are described below.

First, the effect of connection area between the insulating substrate 2 and the radiating base 6 on the warpage of the radiating base 6 is described.

Figure 4:
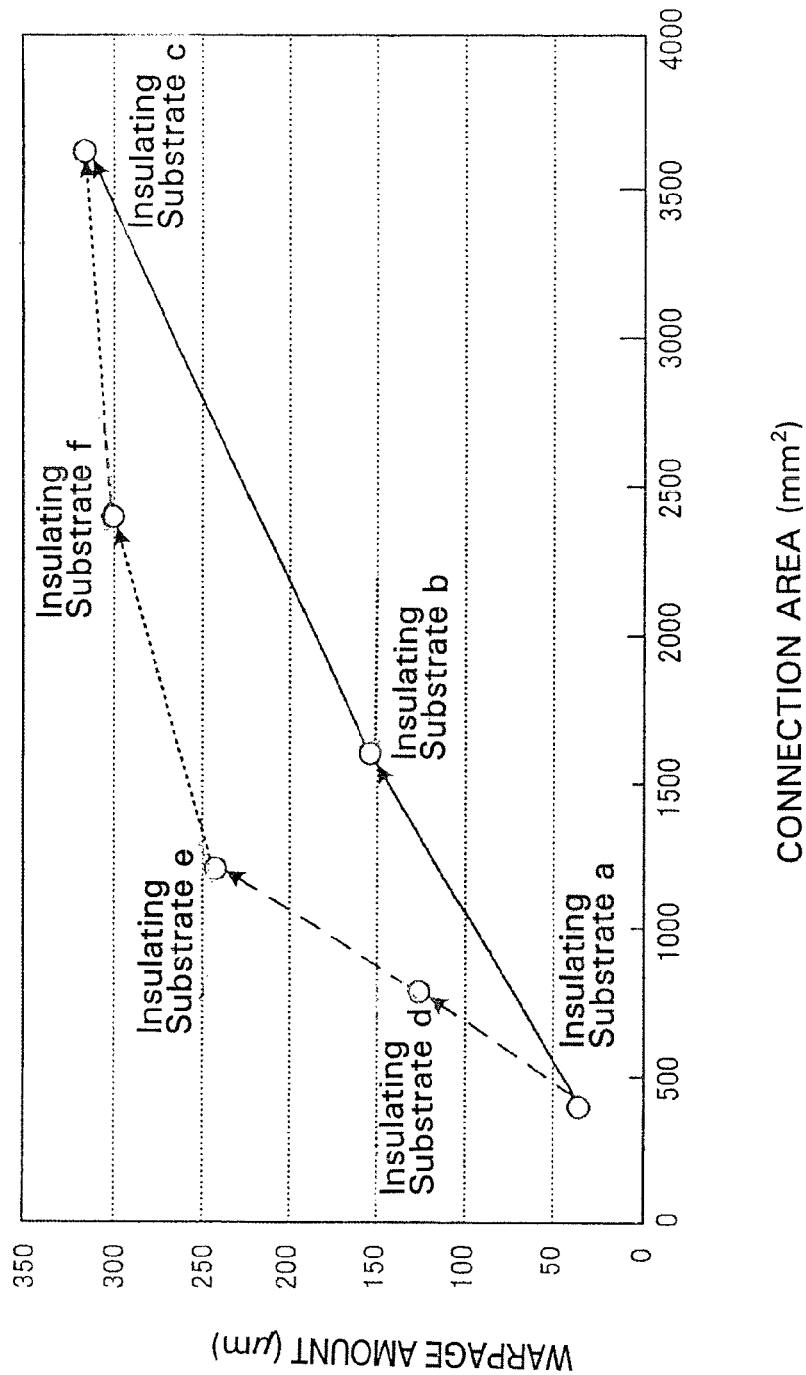
FIG. 4 is a diagram showing a relation between warpage amount of a radiating base and a connection area of an insulating substrate and a radiating base.

FIG. 4 is a diagram showing a relation between warpage amount of a radiating base and connection area of an insulating substrate and a radiating base. In FIG. 4, the abscissa axis represents connection area ($mm^2$) and the ordinate axis represents warpage amount ($\mu m$) of the radiating base.

FIG. 4 shows the results of connecting each insulating substrate a to f to a flat radiating copper base that is not concavely warped beforehand with a lead-free solder and measuring the amount of the convex warpage of the radiating base toward the insulating substrate a to f.

The insulating substrates a to f are such that the insulating substrate a is a flat square standard one showing the smallest connection area, the insulating substrates b and c are flat square ones having increased areas with the same horizontal to vertical length ratios, the insulating substrates d and e are flat rectangular ones having increased longitudinal lengths with the same transverse lengths, and the insulating substrate f is a flat rectangular one obtained from the insulating substrate e by increasing the transverse length with the same longitudinal length. The insulating substrates b and d have the same longitudinal lengths and different transverse lengths, and also the insulating substrates e, f, and c have the same longitudinal lengths and different transverse lengths. Further, the insulating substrates b and f have the same transverse lengths and different longitudinal lengths.

The same lead-free solder was used for connecting each of the insulating substrates a to f and a radiating base. The radiating base had a thickness of 3 mm and a plane size corresponding to that of each insulating substrate a to f. The radiating base had such a plane size that distance from an end of the flat radiating base to an end of each insulating substrate a to f was 10 mm. The warpage amounts of the radiating base after soldering were evaluated based on the displacement of the longitudinal end from the flat state. Here the moving direction is the plus direction.

It was found from FIG. 4 that, in terms of the effect of the connection area on the warpage of the radiating base in the insulating substrates a, b, and c, the warpage amount was proportionally increased with the connection area. It was clear that, in terms of the effect of the longitudinal length of the connection area on the warpage of the radiating base in the insulating substrates a, d, and e, the warpage amount was proportionally increased with the longitudinal length. Further, it was clear that, in terms of the effect of the transverse length of the connection area on the warpage of the radiating base in the insulating substrates e, f, and c, the warpage amount was increased with the transverse length. Thus, the warpage amount of the radiating base connected to each insulating substrate a to f with the lead-free solder is largely affected by the connection area of the insulating substrate a to f.

In other words, in production of the power semiconductor module 1, using the results, the amount of the warpage formed in the radiating base 6 before connecting with the lead-free solder can be determined depending on the size of the insulating substrate 2. In this manner the radiating base 6 can be easily controlled to the flat or approximately flat state, and can be prevented from convexly warping toward the insulating substrate 2.

It should be noted that the tendency shown in FIG. 4 was observed also in the case of using a different type of a lead-free solder.

The warpage amount of the radiating base 6 is changed depending also on division of the insulating substrates 2, even in the case of nearly equal connection areas.

Figure 5:
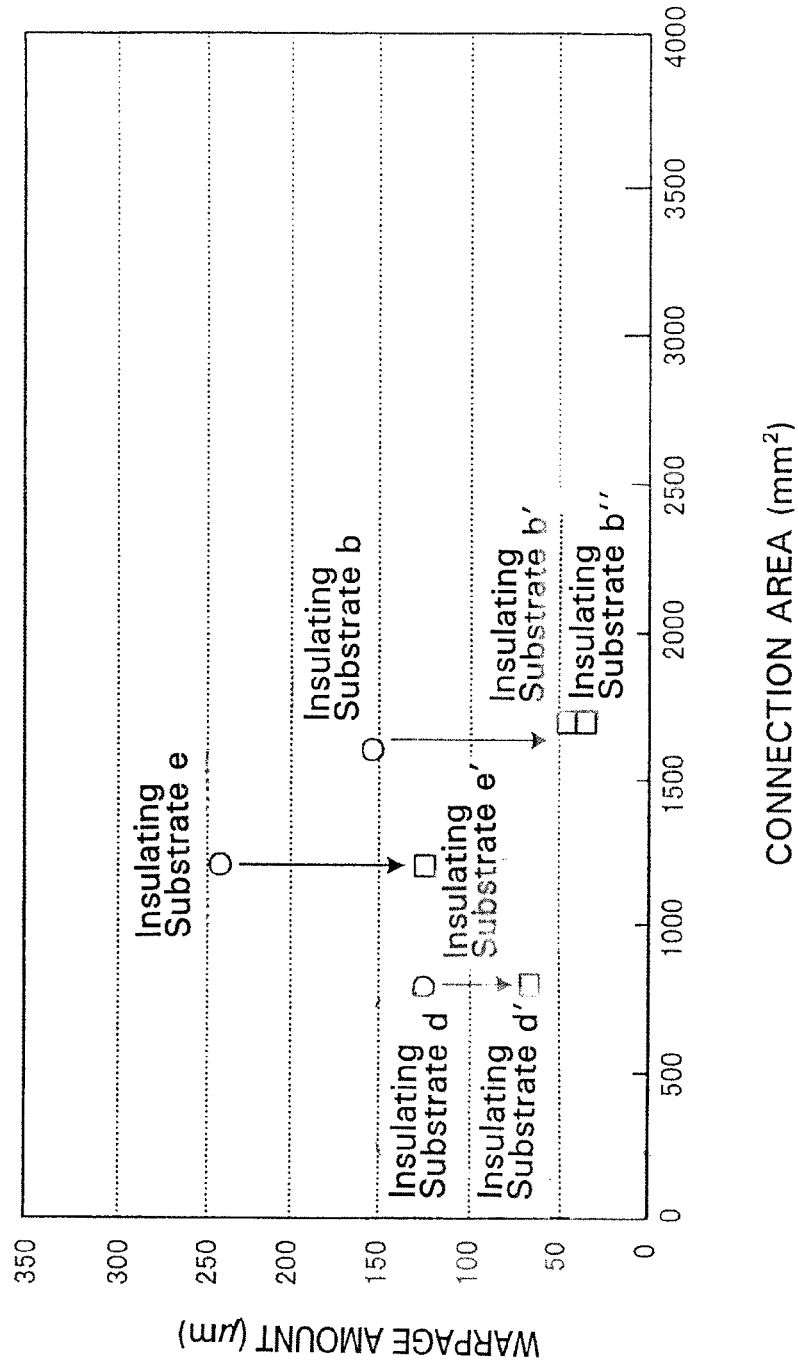
FIG. 5 is an explanatory diagram showing the effect of division of an insulating substrate on warpage amount of a radiating base.

FIG. 5 is an explanatory diagram showing the effect of division of an insulating substrate on warpage amount of a radiating base. In FIG. 5, the abscissa axis represents connection area (mm$^2$) and the ordinate axis represents warpage amount (μm) of a radiating base.

Figure 14:
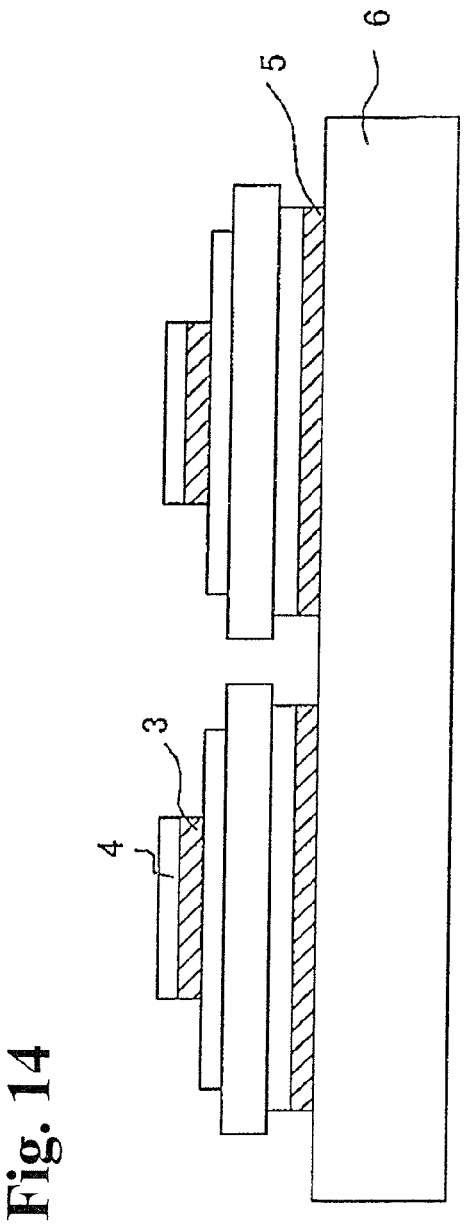
FIG. 14 is a schematic cross-sectional view showing two power semiconductor modules.
Figure 15:
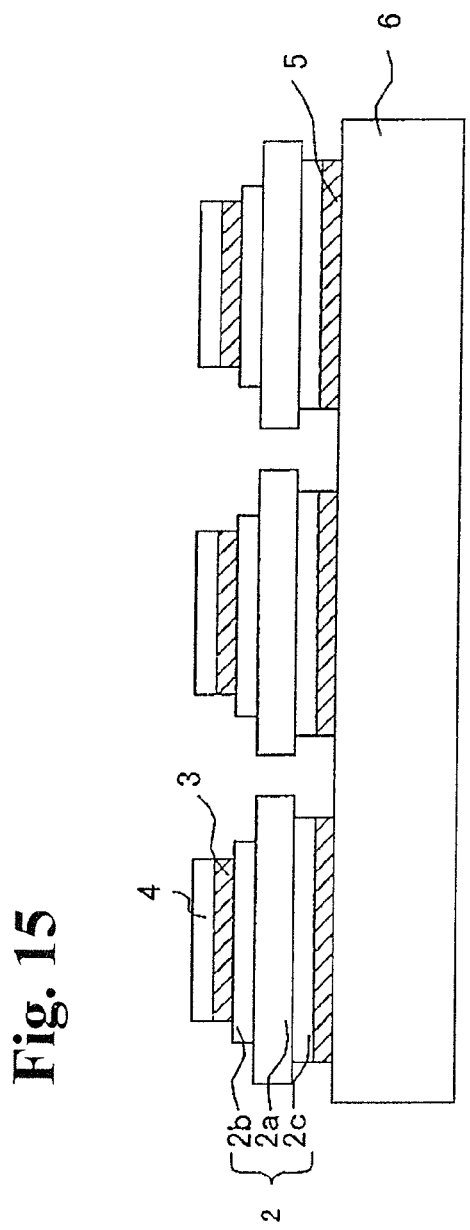
FIG. 15 is a schematic cross-sectional view showing three power semiconductor modules.

Two insulating substrates a of FIG. 4 were solder-connected to a radiating base as shown in FIG. 14 such that the substrates were horizontally arranged with an interval of 2 mm and thus essentially corresponded to a bisected insulating substrate d (an insulating substrate d'). In the same manner, 3 insulating substrates a were solder-connected to a radiating base as shown in FIG. 15 such that the substrates were horizontally arranged with intervals of 2 mm and thus essentially corresponded to a trisected insulating substrate e (an insulating substrate e'). Further, 4 insulating substrates a which were vertically and horizontally arranged or 2 insulating substrates d which were horizontally arranged were solder-connected to a radiating base such that the substrates were arranged with intervals of 2 mm and thus essentially corresponded to a quadrisected or bisected insulating substrate b (insulating substrates b' and b").

The same lead-free solder was used for connecting each of the insulating substrates d', e', b', and b" and the radiating base in the same manner as FIG. 4. The radiating base had a thickness of 3 mm and a plane size corresponding to that of each insulating substrate d', e', b', b". The radiating base had a plane size such that the distance from an end of the radiating base in the flat state to an end of each insulating substrate d', e', b', b" was 10 mm. The warpage amounts of the radiating base after soldering were evaluated based on the displacement of the longitudinal end from the flat state.

It is clear from FIG. 5 that every insulating substrate d', e', b', and b" showed remarkably smaller warpage amount of the radiating base as compared with the corresponding insulating substrates d, e, and b. It should be noted that the tendency shown in FIG. 5 was observed also in the case of using a different type of a lead-free solder.

Thus, in production of the power semiconductor module 1, the amount of the warpage formed in the radiating base 6 before soldering can be determined depending on the division of the insulating substrate 2 with the same connection area.

Figure 6:
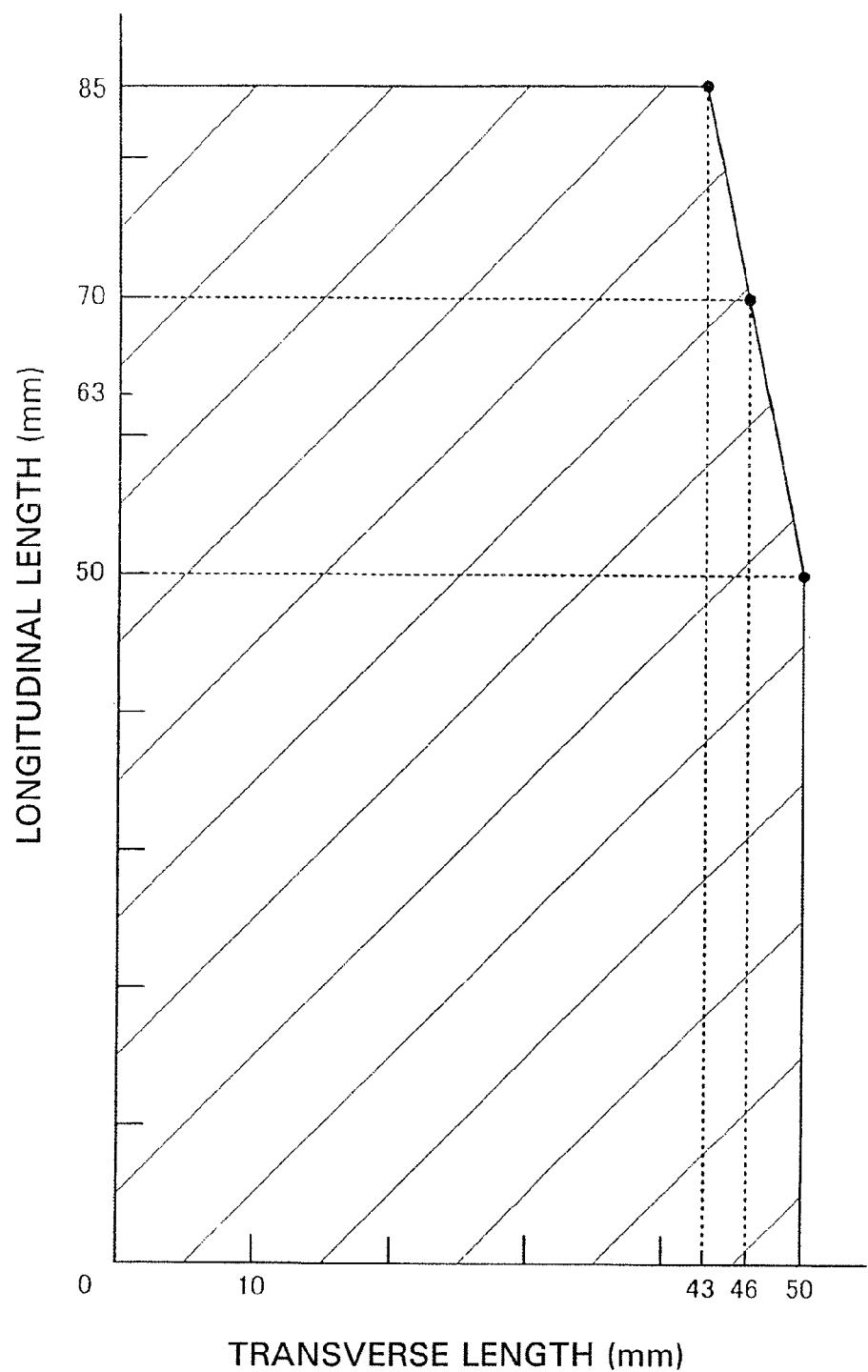
FIG. 6 is an explanatory diagram showing a method of designing an insulating substrate.

FIG. 6 is an explanatory diagram showing a method of designing the insulating substrate.

Shown in FIG. 6 are results of obtaining the size of the insulating substrate corresponding to 250 μm or less of the warpage amount of the 3-mm-thick radiating base by calculation based on the measurement data shown in FIGS. 4 and 5, under the condition that the insulating substrate had the maximum transverse length of 50 mm and the maximum longitudinal length (or the maximum total value of the longitudinal lengths of a plurality of insulating substrates arranged) of 85 mm. In the insulating substrate, the board mainly composed of alumina and the copper foils had the same thickness of 0.25 mm.

The maximum size of the insulating substrate required for the warpage amount of 250 μm or less was 50 mm×50 mm in the case of using 1 insulating substrate, 70 mm×46 mm in the case of using 2 insulating substrates (size of 1 insulating substrate: 35 mm×46 mm), and 85 mm×43 mm in the case of using 3 insulating substrates (size of 1 insulating substrate: 28 mm×43 mm).

Thus, in production of the power semiconductor module 1, the amount of the warpage formed in the radiating base 6 before soldering can be appropriately selected by determining the size and division number of the insulating substrate 2 using these data shown in FIG. 6, etc. Further, thereby the power semiconductor module 1 can be formed with a size corresponding to the maximum size of the insulating substrate 2. When the size of the insulating substrate 2 is increased, the packaging number of the semiconductor chip 4 can be increased, and also the design flexibility degree of the conductor layers 2b and 2c can be increased.

Next, the effect of the thicknesses of the conductor layers 2b and 2c in the insulating substrate 2 on the warpage amount of the radiating base 6 is described.

In the production of the power semiconductor module 1, the radiating base 6 is concavely warped before the soldering step using the lead-free solder, so that a somewhat large space is formed between the flat insulating substrate 2 and the radiating base 6 in the soldering step.

Figure 7:
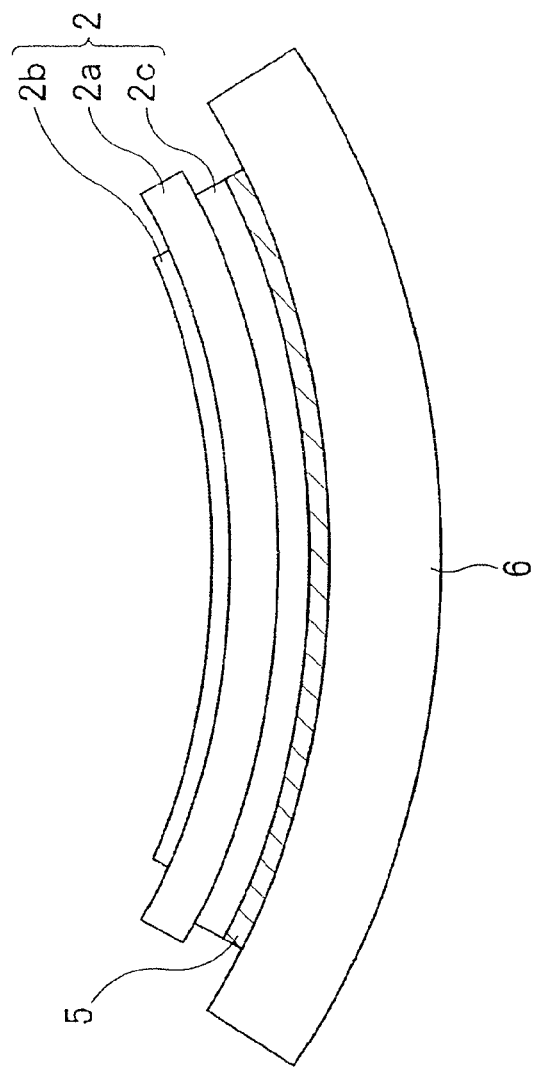
FIG. 7 is a schematic cross-sectional view showing a principal part of an insulating substrate and a radiating base in a soldering step.

FIG. 7 is a schematic cross-sectional view showing a principal part of the insulating substrate and the radiating base in the soldering step.

As described above, by appropriately controlling the thicknesses of the conductor layers 2b and 2c, for example by making the conductor layer 2c thicker than the conductor layer 2b as shown in FIG. 7, the insulating substrate 2 is warped toward the radiating base 6 in the soldering step using the lead-free solder, whereby the space between the insulating substrate 2 and the concave warpage formed beforehand in the radiating base 6 is reduced. Then, the insulating substrate 2 is returned to the flat state after the soldering, while the radiating base 6 is deformed into the flat or approximately flat shape. As a result, the space between the insulating substrate 2 and the radiating base 6 is reduced, whereby the solder layer 5 does not have a portion lacking in the solder amount and generation of an unconnected portion can be prevented.

Among the copper foils used for the conductor layers 2b and 2c, the thicker one contributes to reduce the heat expansion coefficient difference between the insulating substrate 2 and the radiating base 6, whereby large convex warpage of the radiating base 6 toward the insulating substrate 2 can be prevented.

Figure 8:
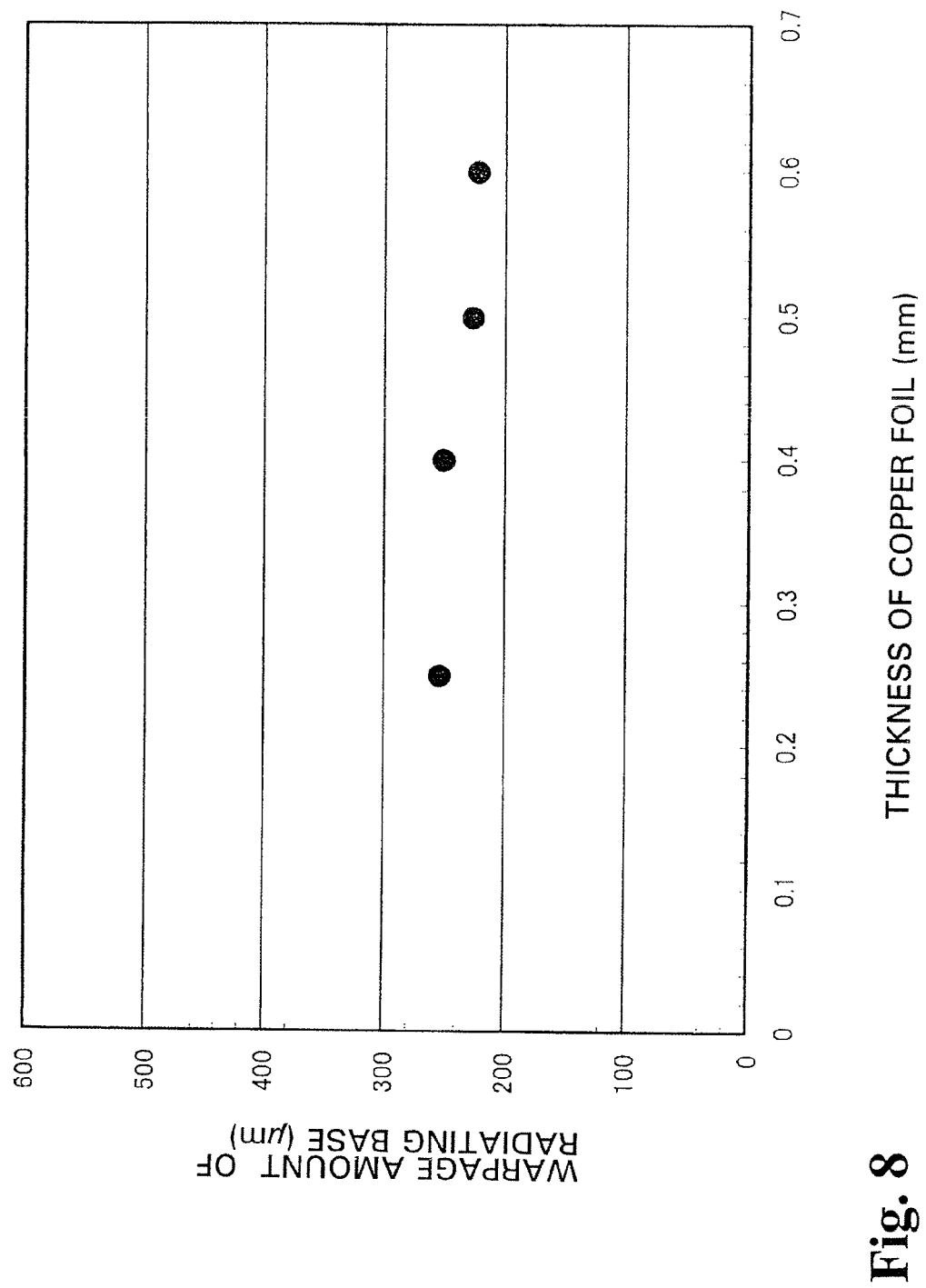
FIG. 8 is a diagram showing a relation between thickness of a copper foil and warpage amount of a radiating base.

FIG. 8 is a diagram showing a relation between the thickness of the copper foil and the warpage amount of the radiating base. In FIG. 8, the abscissa axis represents thickness (mm) of the copper foil formed on the front or back surface of the insulating substrate and the ordinate axis represents warpage amount (μm) of the radiating base.

Therein insulating substrates comprised a board mainly composed of alumina with the same thickness and copper foils with different thicknesses, and the radiating base A of FIG. 2 was used. The copper foils in the front and back surface of each insulating substrate had the same thickness. The same lead-free solder was used for connecting each insulating substrate and the radiating base A. The warpage amounts of the radiating base after soldering were evaluated based on the displacement of the longitudinal end from the flat state.

It is clear from FIG. 8 that the warpage amount of the radiating base A is reduced when the copper foil formed on the board mainly composed of alumina has a thickness of more than 0.4 mm. Thus, the warpage of the radiating base A can be reduced by increasing the thickness of the copper foil formed on the board mainly composed of alumina, thereby reducing the heat expansion coefficient difference between the insulating substrate and the radiating base A. It should be noted that the tendency shown in FIG. 8 was observed also in the case of using a different type of a lead-free solder.

In the production of the power semiconductor module 1 using the radiating base 6 warped concavely before the soldering, when the conductor layer 2c is thicker than the conductor layer 2b or alternatively the conductor layers 2b and 2c have thicknesses of more than 0.4 mm, generation of an unconnected portion can be prevented between the insulating substrate 2 and the radiating base 6 and the radiating base 6 can be prevented from convexly warping toward the insulating substrate 2 after it is converted from concave to flat. Further, the amount of the warpage formed in the radiating base 6 before the soldering can be reduced.

It is preferred that the thicknesses of the conductor layers 2b and 2c are 0.4 mm or more and are made as large as possible in view of applying a desired current to the semiconductor chip 4 formed on the conductor layer 2b, the above heat expansion coefficient difference, and the material and thickness of the ceramic board 2a. The connecting properties of the conductor layers 2b and 2c to the ceramic board 2a depend on the material and thickness of the ceramic board 2a. For example, in a case where the ceramic board 2a is mainly composed of silicon nitride, the conductor layers 2b and 2c having thicknesses of more than 0.8 mm can be connected thereto. Also in a case where the board is mainly composed of alumina, the conductor layers 2b and 2c having thicknesses of more than 0.8 mm can be connected thereto.

Although the thicknesses of the conductor layers 2b and 2c of the insulating substrate 2 are noted above, the volume ratio between the conductor layers 2b and 2c may be appropriately selected. For example, the volume ratio of the conductor layer 2c to the conductor layer 2b is controlled to 1 or more. Under such a volume ratio, the thickness of the conductor layer 2b may be larger than, equal to, or smaller than that of the conductor layer 2c depending on patterning shape of the conductor layers 2b and 2c, generation of the above unconnected portion and a large convex warpage can be prevented, and the amount of the warpage formed in the radiating base 6 beforehand can be reduced.

Next the effect of the thickness of the ceramic board 2a in the insulating substrate 2 on the warpage amount of the radiating base 6 is described.

The thickness of the ceramic board 2a may be reduced to lower the heat expansion coefficient difference between the insulating substrate 2 and the radiating base 6 based on perspective equal to the above of controlling the thicknesses of the conductor layers 2b and 2c in the insulating substrate 2.

Figure 9:
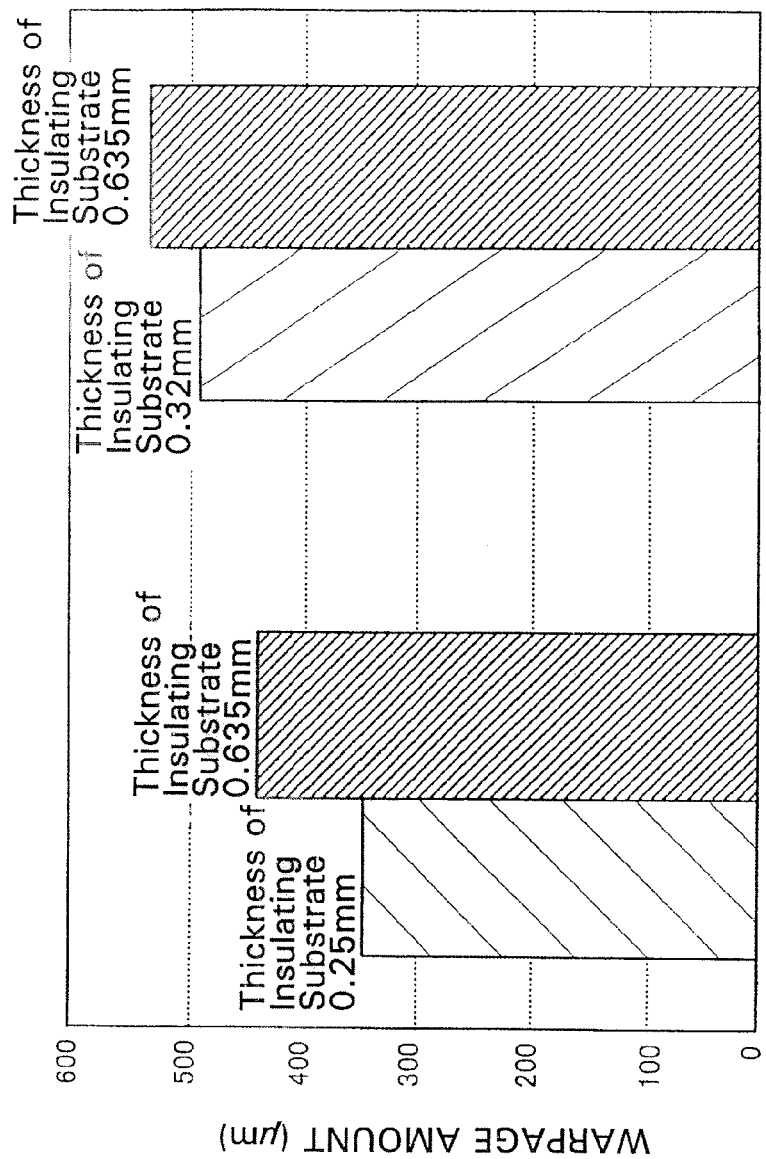
FIG. 9 is a diagram showing a relation between thickness of a ceramic board and warpage amount of a radiating base.

FIG. 9 is a diagram showing a relation between thickness of the ceramic board and warpage amount of the radiating base. In FIG. 9, the ordinate axis represents warpage amount (μm) of the radiating base.

Here the radiating bases A and B of FIG. 2 were used in the flat states without concavely warping them beforehand. And boards mainly composed of alumina with thicknesses of 0.25 mm, 0.32 mm, and 0.635 mm were each used for insulating substrates, copper foils with the same thicknesses being formed on each board. The same lead-free solder was used for connecting the radiating bases A and B to the insulating substrates. The warpage amounts of the radiating base after soldering were evaluated based on the displacement of the longitudinal end from the flat state.

It is clear from FIG. 9 that the warpage amount is reduced with the thickness of the board mainly composed of alumina in both the cases of radiating bases A and B is reduced. Thus, by thinning the board mainly composed of alumina to reduce the heat expansion coefficient difference between the insulating substrate and the radiating base A, B, the warpage of the radiating base A, B can be reduced. Among ceramics, alumina is particularly efficient for reducing the warpage of the radiating base A, B because its heat expansion coefficient (about 8 ppm/K) is relatively close to those of metals. It should be noted that the tendency shown in FIG. 9 was observed also in the case of using a different type of a lead-free solder.

In the production of the power semiconductor module 1, by appropriately controlling the thickness of the ceramic board 2a mainly composed of alumina to form the insulating substrate 2, an unconnected portion is not formed between the insulating substrate 2 and the radiating base 6 and the radiating base 6 can be prevented from convexly warping toward the insulating substrate 2. This is true for a ceramic board mainly composed of silicon nitride.

It is preferred that the ceramic board 2a in the insulating substrate 2 has a thickness of 0.635 mm or less from the viewpoint of maintaining certain level of heat transfer efficiently and strength of the insulating substrate 2 in addition to preventing generation of an unconnected portion and warpage of the radiating base 6 toward the insulating substrate 2. Further, it is preferred that the thickness is within the range of 0.2 to 0.4 mm from the viewpoint of heat conduction of the ceramic board 2a, etc. The warpage amount is larger in the case of the thickness of the ceramic board 2a is 0.635 mm as shown in FIG. 9, as compared with the cases of the thicknesses of 0.25 mm and 0.32 mm. By properly selecting the characteristics of the radiating base 6, generation of an unconnected portion can be prevented between the insulating substrate 2 and the radiating base 6, and the radiating base 6 can be prevented from convexly warping toward the insulating substrate 2.

Next the effect of the thickness of the radiating base 6 on the warpage amount is described.

Figure 10:
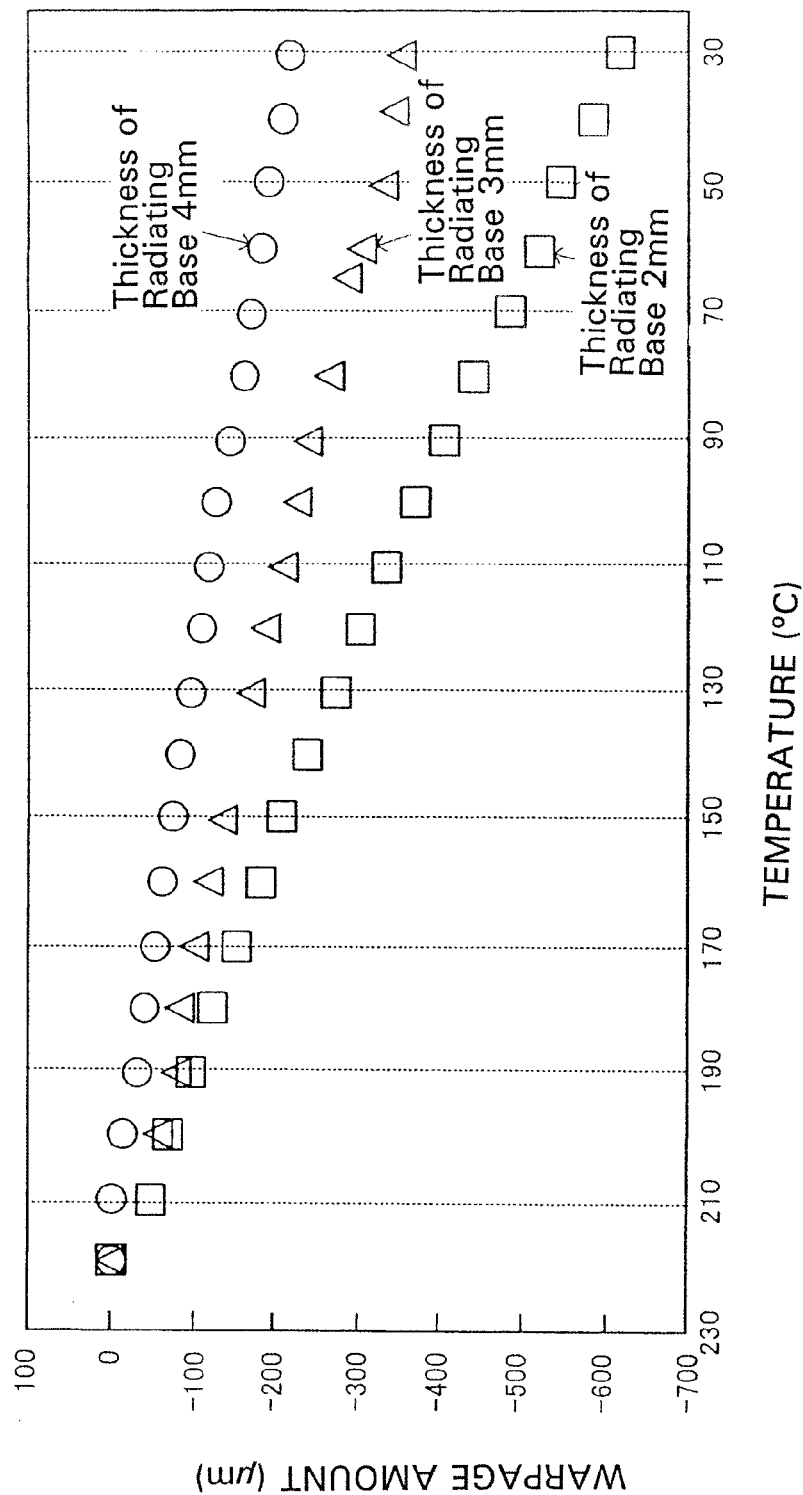
FIG. 10 is a diagram showing a relation between thickness and warpage amount of a radiating base.
Figure 11:
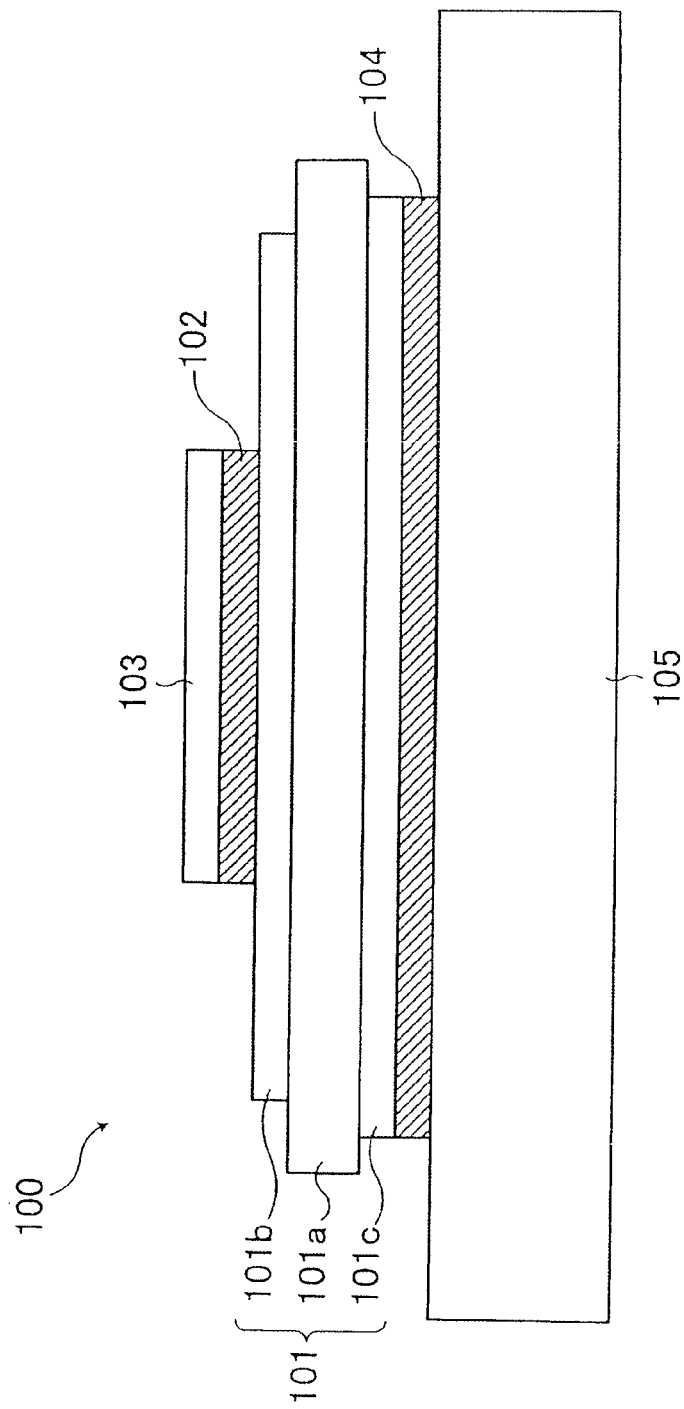
FIG. 11 is a schematic cross-sectional view showing a principal part of a conventional power semiconductor module.
Figure 12:
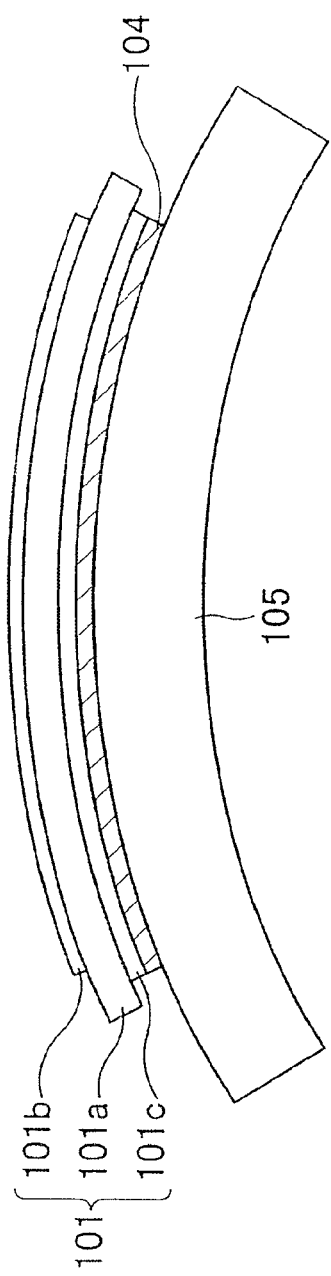
FIG. 12 is a schematic cross-sectional view showing a principal part of a warped radiating base.
Figure 13:
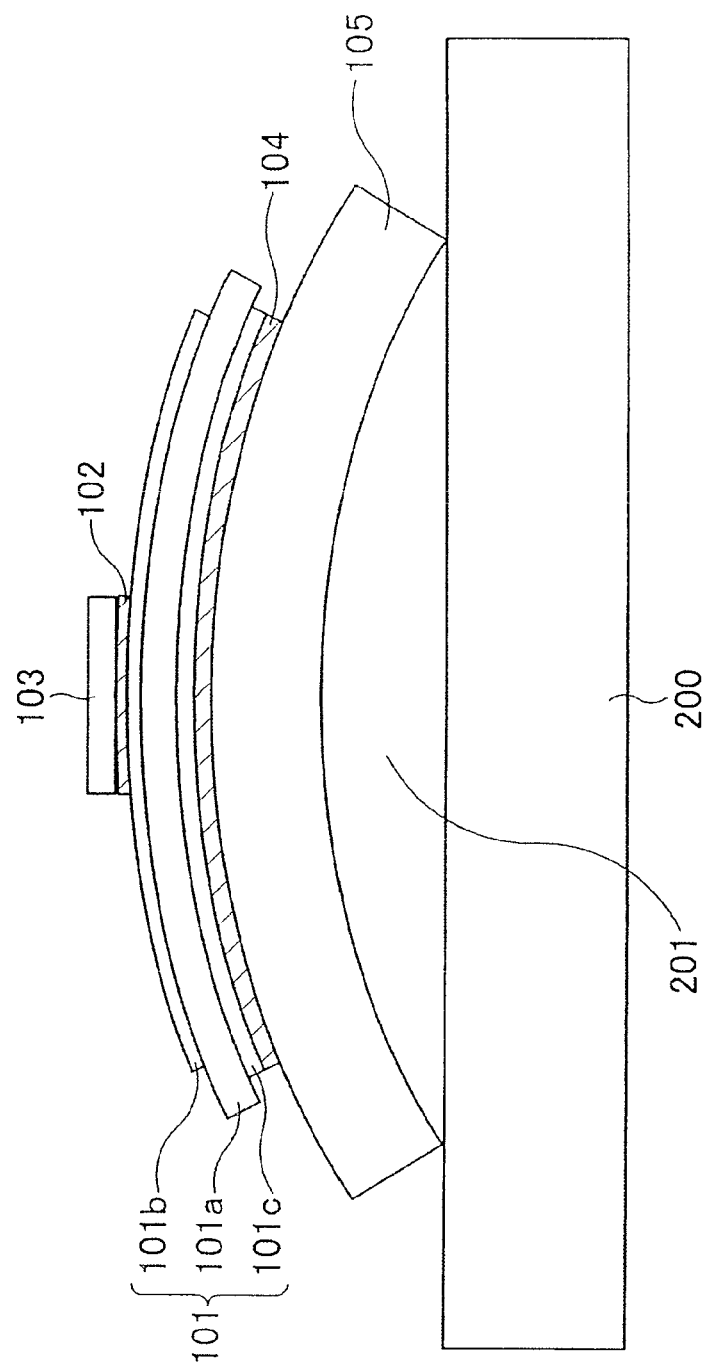
FIG. 13 is a schematic cross-sectional view showing a principal part of the step of assembling a power semiconductor module.

FIG. 10 is a diagram showing a relation between thickness and warpage amount of the radiating base. In FIG. 10, the abscissa axis represents temperature (° C.) for soldering and the ordinate axis represents warpage amount (μm) of the radiating base.

Radiating bases having thicknesses of 2 mm, 3 mm, and 4 mm with the same plane sizes were heat-treated under conditions equal to those for common soldering processes using a lead-free solder to measure warpage amount at each temperature. The warpage amount was evaluated based on the displacement such that the uppermost end of the radiating base was standard (0 μm) and the moving direction thereof was the minus direction.

As shown in FIG. 10, the thicker the radiating base is, the smaller the change of the warpage amount against temperature is. At 30° C., the thinnest 2-mm radiating base showed the maximum warpage amount and the thickest 4-mm radiating base showed the minimum warpage amount, the warpage amounts at 30° C. meaning the warpage amounts after soldering. Thus, it is clear that the warpage amount is reduced as the radiating base becomes thicker. Particularly in a case where the radiating base has a thickness of 3 mm or more, the warpage is relatively smaller, whereby the amount of the warpage formed beforehand can be reduced.

In production of the power semiconductor module 1 using the radiating base 6 concavely warped beforehand, when the radiating base 6 is thicker, the amount of the warpage formed beforehand can be smaller, and the radiating base 6 can be prevented from largely convex-warping toward the insulating substrate 2. In production of the power semiconductor module 1, it is preferred that the thickness of the radiating base 6 is within the range of 3 to 4 mm from the viewpoints of the resultant warpage amount, ease of converting into the flat or approximately flat state, the size of the power semiconductor module 1, etc. Even in a case where the radiating base 6 has a thickness of less than 3 mm, by properly selecting the properties of the insulating substrate 2, the amount of the warpage formed beforehand can be reduced and the radiating base 6 can be prevented from largely convex-warping toward the insulating substrate 2. In view of this point, the thickness of the radiating base 6 may be within the range of 2 to 4 mm to produce the power semiconductor module 1.

As described above, in production of the power semiconductor module 1 using the lead-free solder, the amount of the warpage formed in the radiating base 6 before the soldering can be determined depending on various factors having impact on the warpage amount, thus properties of the insulating substrate 2 (the connection area to the radiating base 6, the division state, the thicknesses of the conductor layers 2b and 2c, and the thickness of the ceramic board 2a) and properties of the radiating base 6 (the plane size and the thickness). The power semiconductor module 1 can be obtained by appropriately selecting the warpage amount with a high crack resistance, a high performance, a high reliability, and a long life, and elution of lead, generation of an unconnected portion between the insulating substrate 2 and the radiating base 6, and formation of a large gap between the radiating base 6 and a cooling fin can be prevented.

Finally, a method for forming the radiating base 6 is described.

The radiating base 6 can be formed by using a pressing mold. In the case of forming the radiating base 6 having the warpage, a pressing mold having a shape corresponding to the warpage is used. For example, to form a radiating base 6 made of copper, copper powder is charged into a pressing mold having a predetermined shape, pressed to form a molded body, and heat-treated in an inert gas atmosphere, etc. A radiating base 6 having a shape corresponding to the pressing mold can be formed in this manner. In such a method, radiating bases 6 having various warpage amounts and plane sizes can be formed by changing the pressing mold without mechanical working.

As described above, in the power semiconductor module 1 having the above structure, the lead-free solder is used for connecting the semiconductor chip 4 and the insulating substrate 2 and for connecting the insulating substrate 2 and the radiating base 6, whereby environmental contamination can be prevented. Further, in addition to the use of the lead-free solder, the radiating base 6 is concavely warped before soldering such that it is in the flat or approximately flat state after the soldering, whereby the contact thermal resistance between the radiating base 6 and a cooling fin can be lowered. As a result, a high-performance, high-reliability power semiconductor module 1 can be realized with excellent properties for radiating the semiconductor chip 4. Further, the type of the lead-free solder can be selected depending on the desired properties of the power semiconductor module 1 to improve the crack resistance and the life of the power semiconductor module 1.

Though the connection of the insulating substrate 2 and the radiating base 6 with the lead-free solder in the power semiconductor module 1 is mainly described in the above description, the method of the present invention can be applied to connecting members with a relatively large heat expansion coefficient difference with a lead-free solder in other semiconductor devices.

The disclosure of Japanese Patent Application No. 2005-011369 filed on Jan. 19, 2005, is incorporated herein.

What is claimed is:

1. A method for producing a semiconductor device comprising:
    solder-connecting a semiconductor chip, onto an insulating substrate comprising a ceramic board and having conductor layers on two surfaces thereof, with a lead-free solder,
    warping a radiating base such that a surface of the radiating base on a side opposite to the insulating substrate is convex, and
    solder-connecting the insulating substrate onto the warped radiating base with the lead-free solder so as to provide a substantially flat solder-connected radiating base,
    wherein the conductive layer on one surface of the insulating substrate solder-connecting to the radiating base has a thickness greater than that of the conductive layer on the other surface of the insulating substrate.

2. The method for producing a semiconductor device according to claim 1, wherein the lead-free solder has a melting point of 250° C. or lower.

3. The method for producing a semiconductor device according to claim 1, wherein the lead-free solder comprises tin and at least one element selected from the group consisting of silver, bismuth, indium, antimony, zinc, aluminum, and copper.

4. The method for producing a semiconductor device according to claim 1, wherein the radiating base is warped to an extent determined by properties of the insulating substrate.

5. The method for producing a semiconductor device according to claim 4, wherein the radiating base is warped to an extent determined by a connection area between the radiating base and the insulating substrate.

6. The method for producing a semiconductor device according to claim 5, wherein the insulating substrate is divided into a plurality of portions, and the radiating base is warped to an extent determined by a connection area between the radiating base and the divided insulating substrate.

7. The method for producing a semiconductor device according to claim 5, wherein the radiating base is warped to an extent determined by a thickness of the conductor layer in the insulating substrate.

8. The method for producing a semiconductor device according to claim 4, wherein the radiating base is warped to an extent determined by a volume ratio between the conductor layers disposed on both surfaces of the ceramic board in the insulating substrate.

9. The method for producing a semiconductor device according to claim 4, wherein the radiating base is warped to an extent detei uiined by a thickness of the ceramic board in the insulating substrate.

10. The method for producing a semiconductor device according to claim 1, wherein the radiating base is warped to an extent determined by a thickness of the radiating base.

11. The method for producing a semiconductor device according to claim 1, wherein, in the insulating substrate, the conductor layers comprise a copper foil, and the ceramic board comprises alumina as a main component.

12. The method for producing a semiconductor device according to claim 1, wherein the radiating base comprises copper.

13. A method for producing a semiconductor device comprising:
- dividing an insulating substrate having a length of 70 mm and a width of 46 mm to two pieces, each of the two pieces comprising a ceramic board and having conductor layers on two surfaces thereof,
- solder-connecting each of the two pieces with one semiconductor chip with a lead-free solder,
- warping a radiating base such that a surface of the radiating base on a side opposite to the insulating substrate is convex, and
- solder-connecting each of the two pieces with the one semiconductor chip, onto the warped radiating base, with the lead-free solder so as to provide a substantially flat solder-connected radiating base,
- wherein a connection area between each of the insulating substrates and the radiating base is greater than or equal to 400 mm$^2$ and less than 1610 mm$^2$.

14. A method for producing a semiconductor device comprising:
- dividing an insulating substrate having a length of 85 mm and a width of 43 mm to three pieces, each of the three pieces comprising a ceramic board and having conductor layers on two surfaces thereof,
- solder-connecting each of the three pieces with one semiconductor chip with a lead free solder,
- warping a radiating base such that a surface of the radiating base on a side opposite to the insulating substrate is convex, and
- solder-connecting each of the three pieces with the one semiconductor chip, onto the warped radiating base, with the lead-free solder so as to provide a substantially flat solder-connected radiating base,
- wherein a connection area between each of the insulating substrates and the radiating base is greater than or equal to 400 mm$^2$ and less than 1204 mm$^2$.

15. The method for producing a semiconductor device according to claim 1, wherein the lead-free solder has a composition of tin and antimony, a composition of tin, silver, bismuth, and indium, or a composition of tin, antimony, and silver.

16. A method for producing a semiconductor device comprising:
- preparing an insulating substrate comprising a ceramic board, a first conductive layer on one surface of the insulating substrate, and a second conductive layer having a thickness greater than the first conductive layer on another surface of the insulating substrate;
- solder-connecting a semiconductor chip onto the first conductive layer of the insulating substrate with a first lead-free solder;
- warping a radiating base so that a concave surface of the radiating base faces toward the second conductive layer on the insulating substrate;
- solder-connecting the insulating substrate to the radiating base with a second lead-free solder to warp the insulating substrate toward the radiating base to reduce a space between the insulating substrate and the radiating base; and
- allowing the insulating substrate to return to a flat state after solder-connecting the insulating substrate to the radiating base, to thereby deform the radiating base to be flat or substantially flat.